(12) United States Patent
Hsieh

(10) Patent No.: US 6,965,144 B2
(45) Date of Patent: Nov. 15, 2005

(54) STRUCTURE AND FABRICATING METHOD WITH SELF-ALIGNED BIT LINE CONTACT TO WORD LINE IN SPLIT GATE FLASH

(75) Inventor: Chia Ta Hsieh, Tainan (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 10/901,788

(22) Filed: Jul. 29, 2004

(65) Prior Publication Data

US 2005/0003622 A1 Jan. 6, 2005

Related U.S. Application Data

(62) Division of application No. 10/224,215, filed on Aug. 20, 2002, now Pat. No. 6,858,494.

(51) Int. Cl.[7] .............................................. H01L 29/76
(52) U.S. Cl. ...................................... 257/319; 438/257
(58) Field of Search .............................. 257/314–316, 257/319, 321, 322, 900; 365/185.01; 438/210, 438/211, 257, 264, 266, 267, 304, 593–596

(56) References Cited

U.S. PATENT DOCUMENTS

| | | | |
|---|---|---|---|
| 4,907,047 A | 3/1990 | Kato et al. ................. 357/23.6 |
| 5,091,327 A | 2/1992 | Bergemont ................... 437/43 |
| 5,185,284 A | 2/1993 | Motonami .................... 437/52 |
| 5,208,657 A | 5/1993 | Chatterjee et al. ........... 257/302 |
| 5,574,621 A | 11/1996 | Sakamoto et al. ........ 361/321.1 |
| 5,616,510 A * | 4/1997 | Wong .......................... 438/259 |
| 5,679,591 A | 10/1997 | Lin et al. ....................... 437/43 |
| 5,691,937 A | 11/1997 | Ohta ..................... 365/185.01 |
| 5,792,695 A * | 8/1998 | Ono et al. ................... 438/257 |
| 5,793,075 A | 8/1998 | Alsmeier et al. ........... 257/296 |
| 5,939,749 A * | 8/1999 | Taketa et al. ............... 257/316 |
| 6,037,620 A | 3/2000 | Hoenigschmid et al. .... 257/296 |
| 6,090,668 A | 7/2000 | Lin et al. ..................... 438/266 |
| 6,177,697 B1 | 1/2001 | Cunningham ............... 257/301 |
| 6,211,012 B1 | 4/2001 | Lee et al. .................... 438/257 |
| 6,228,695 B1 | 5/2001 | Hsieh et al. ................. 438/201 |
| 6,569,736 B1 * | 5/2003 | Hsu et al. .................... 438/267 |

* cited by examiner

*Primary Examiner*—Asok Kumar Sarkar
(74) *Attorney, Agent, or Firm*—Thomas, Kayden, Horstemeyer & Risley

(57) ABSTRACT

A new structure is disclosed for semiconductor devices in which contact regions are self-aligned to conductive lines. Openings to a gate oxide layer, in partially fabricated devices on a silicon substrate, have insulating sidewalls. First polysilicon lines disposed against the insulating sidewalls extend from below the top of the openings to the gate oxide layer. Oxide layers are grown over the top and exposed sides of the first polysilicon lines serving to insulate the first polysilicon lines. Polysilicon contact regions are disposed directly over and connect to silicon substrate regions through openings in the gate oxide layer and fill the available volume of the openings. Second polysilicon lines connect to the contact regions and are disposed over the oxide layers grown on the first polysilicon lines.

13 Claims, 14 Drawing Sheets

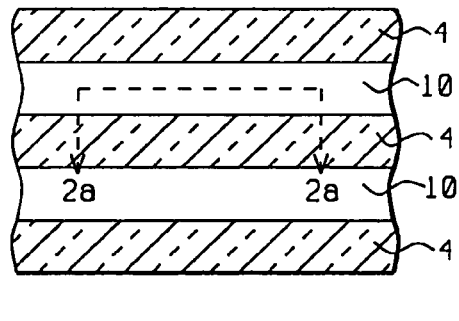
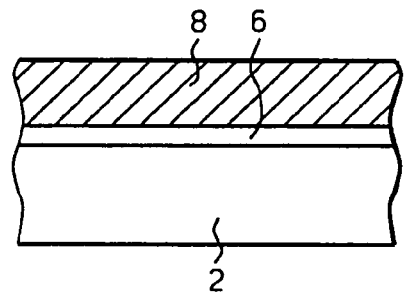
FIG. 1a – Prior Art
FIG. 2a – Prior Art
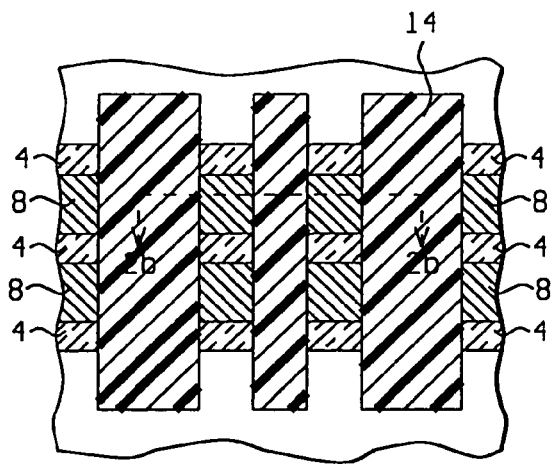
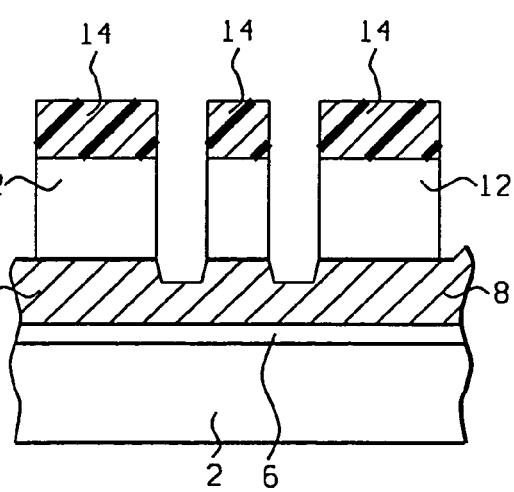
FIG. 1b – Prior Art
FIG. 2b – Prior Art

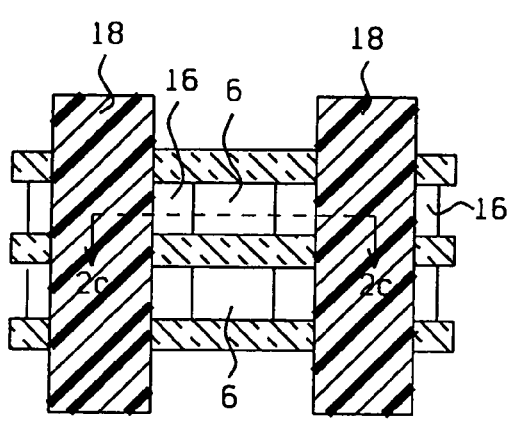
FIG. 1c – Prior Art
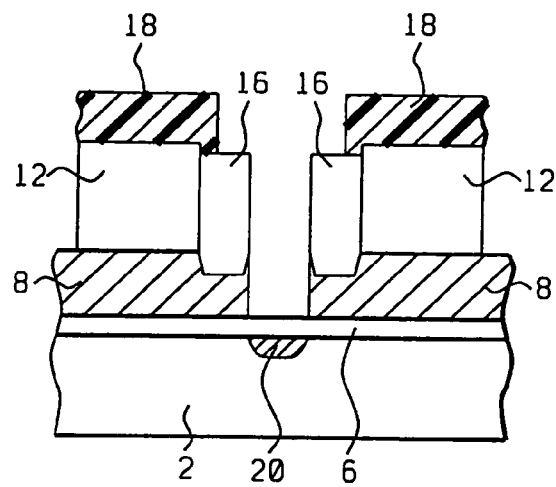
FIG. 2c – Prior Art
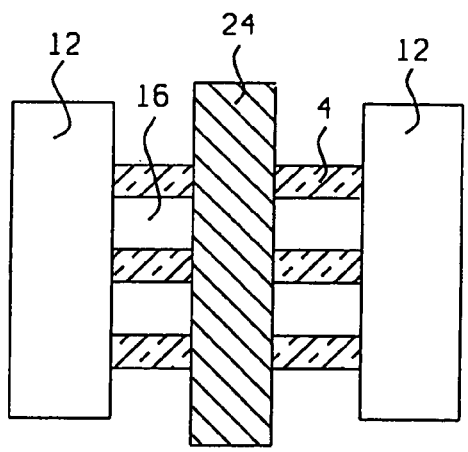
FIG. 1d – Prior Art
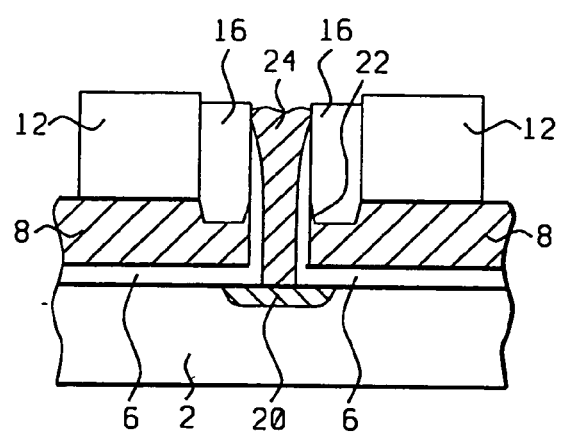
FIG. 2d – Prior Art

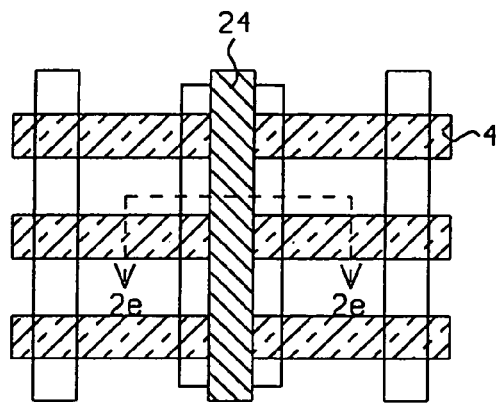
FIG. 1e – Prior Art
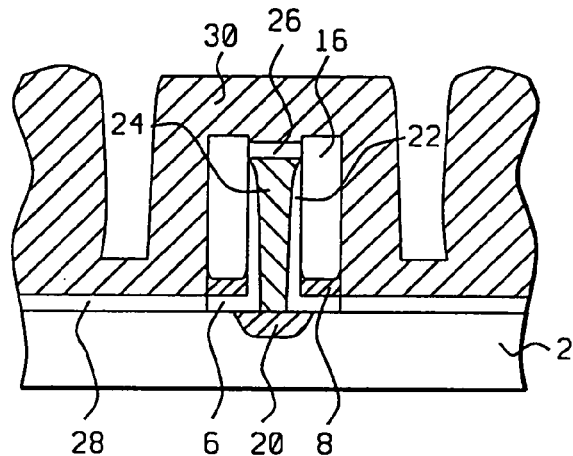
FIG. 2e – Prior Art
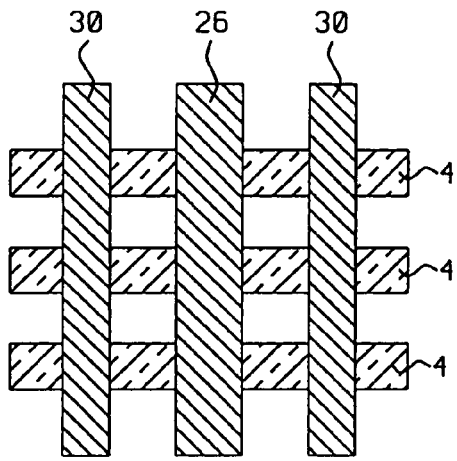
FIG. 1f – Prior Art
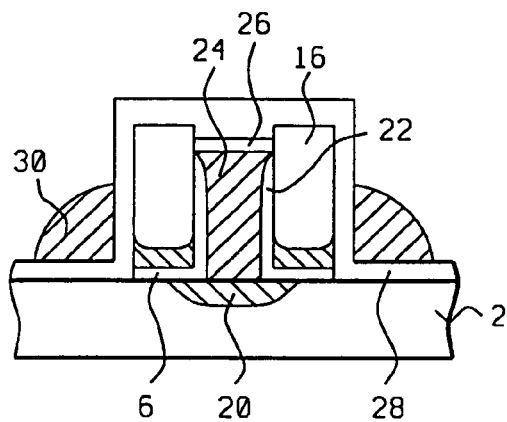
FIG. 2f – Prior Art

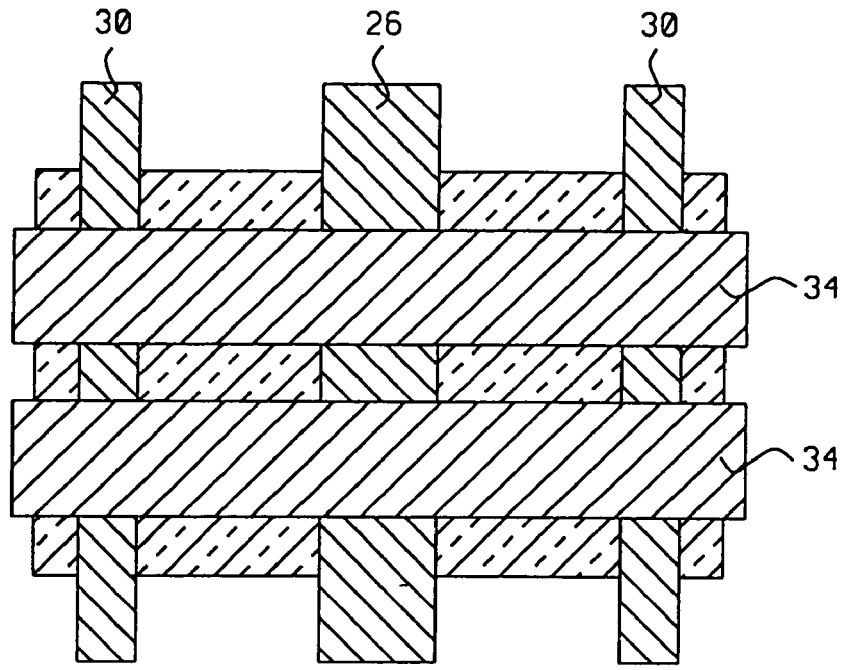
FIG. 1g – Prior Art
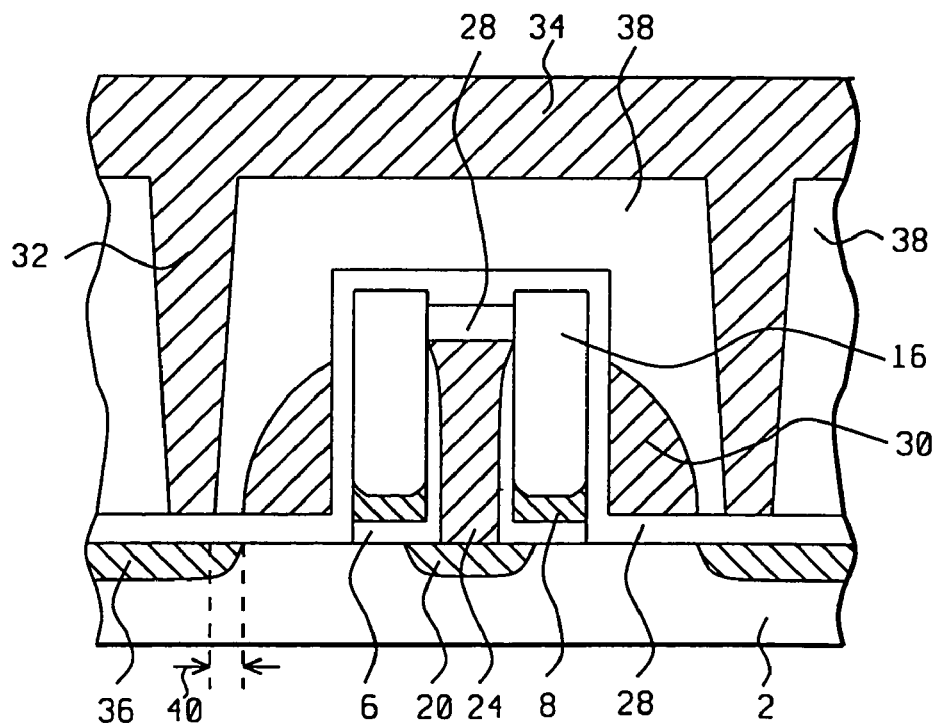
FIG. 2g – Prior Art

STRUCTURE AND FABRICATING METHOD WITH SELF-ALIGNED BIT LINE CONTACT TO WORD LINE IN SPLIT GATE FLASH

CROSS-REFERENCE TO RELATED APPLICATION

This application is a division of U.S. patent application Ser. No. 10/224,215, filed Aug. 20, 2002 now U.S. Pat. No. 6,858,494.

BACKGROUND OF THE INVENTION (1) Field of the Invention

The present invention relates generally to semiconductor integrated circuit technology and more particularly to split gate memory cells used in flash EPROMs (Electrically Erasable Programmable Read Only Memory).

(2) Description of Prior Art

Increased performance in computers is often directly related to a higher level of circuit integration. Tolerances play an important role in the ability to shrink dimensions on a chip. Self-alignment of components in a device serves to reduce tolerances and thus improve the packing density of chips. Other techniques can be important in shrinking device size. A method is disclosed later in the embodiments of the present invention of forming a structure with self-aligned bit line contact to word line through which a significant reduction in the area of the split gate flash cell is possible.

As is well known in the art, split gate flash cells have bit lines and word lines and bit contacts that connect bit lines to drain regions. Bit lines and bit contacts are insulated from the word lines by an interlevel dielectric layer. The separation between bit contacts and word lines must be maintained large enough so as to avoid possible shorts that could develop between adjacent bit contacts and word lines. Bit contact to word line separations are determined by the positions of bit contact openings, which are set by a design rule. In arriving at the design rule the possibility of misalignment must be taken into account, which results in a required separation well beyond that needed to avoid development of shorts. This requirement for increased separation, arising from the need to account for unavoidable misalignment, limits the ability to decrease cell size. Self-alignment of the bit contact to the word line, as in the structures disclosed by the present invention, eliminates the reliability issue, allows a reduction in cell area and facilitates shrinking the cell size.

A traditional method of fabricating a split gate flash memory cell is presented in FIGS. 1a–1g, where top views of the cell are presented at successive stages of the process and in FIGS. 2a–2g, which show the corresponding cross-sections. A floating gate oxide, 6, is formed on a semiconductor substrate, 2, which preferably is a silicon substrate, to a thickness of about 80 Angstroms, followed by deposition of a poly 1 layer, 8, to a depth of about 800 Angstroms. Active regions, 10, are defined using isolating regions, such as shallow trench isolation regions, 4. This is followed by deposition of a nitride layer, which preferably is a silicon nitride layer to a depth of about 2500 Angstroms. A photoresist layer, 14, is then formed as shown in FIGS. 1b and 2b. The photoresist pattern, 14, is used in etching the silicon nitride layer to achieve the shape of region 12 of FIG. 2b. It is advantages to perform a poly 1 etch so as to achieve the shape of region 8 as shown in FIG. 2b. Details of the method to fabricate such sharp poly tips are presented in U.S. Pat. No. 6,090,668 to Lin et al., which is herein incorporated by reference. Such sharp poly tips are advantageous because they provide enhanced erase speed. After removal of the photoresist, an oxide 2 layer, 16, is deposited to a thickness of about 3000 Angstroms and a CMP (chemical-mechanical polishing) step is performed. A second photoresist layer, 18, is formed and used in successively etching the silicon nitride layer and the poly 1 layer to achieve the structure shown in FIGS. 1c and 2c. Source regions 20 are formed by a P ion implantation at energy of about 20 keV and to a dose of about 4E14 per cm2. Removal of the second photoresist layer is followed by deposition of an oxide 3 layer to a depth of about 500 Angstroms, which enhances the lateral diffusion of the source implant. An oxide 3 etching step is performed to achieve oxide 3 spacers, 22. A polysilicon deposition is performed to a depth of about 3000 Angstroms and a CPM step on this layer produces a poly 2 region 24, which serves to contact the source 20. At thus stage the structure is as depicted in FIGS. 1d and 2d. The traditional method proceeds with oxidation of poly 2, 24, to form about 200 Angstroms of oxide 4, 26. Next the nitride layer 12 is removed, and successive etches are performed of the poly 1 layer, 8, and floating gate oxide 1 layer, 6. After a poly 3 deposition, 30, to about 2000 Angstroms, the structure is as shown in FIGS. 1e and 2e. Etching the poly 3 layer, poly spacers, 30, are formed that serve as word lines. A drain implant is now performed that usually is an As implant at energy about 60 keV and to a dose of about 4E15 per cm2. This forms the drain regions 36. An interlevel dielectric (ILD) layer, 38 is deposited. A photoresist layer is formed and patterned so that upon etching of the IDL layer, contacts are opened to the drain regions. A metal 1 deposition follows removal of the photoresist layer. Another photoresist layer is formed and patterned so that after etching metal 1 bit lines 34 are formed connecting to the drain regions, 36 through the metal 1 contact regions 32. This completes the formation of a traditional split gate flash cell, which is shown in FIGS. 1g and 2g.

Bit lines, 34 and bit contacts, 32 are insulated from the word lines, 30 by an interlevel dielectric layer, 38. The minimum separation, 40, is between bit contacts and word lines and this separation must be maintained large enough so as to avoid possible shorts that could develop between adjacent bit contacts and word lines. Bit contact to word line separations are determined by the positions of bit contact openings relative to word lines and the dimensions of the openings, which are set by design rules. In arriving at the design rule the possibility of misalignment and variability in the production of contact openings must be taken into account, which results in a required minimum separation well beyond that needed to avoid development of shorts. This requirement for increased separation limits the ability to decrease cell size. Self-alignment of the bit contact to the word line, as in the structures disclosed by the present invention, eliminates the reliability issue, allows a reduction in cell area and facilitates shrinking the cell size.

A split-gate flash memory cell having self-aligned source and floating gate self aligned to control gate, is disclosed in U.S. Pat. No. 6,228,695 to Hsieh et al. In U.S. Pat. No. 6,211,012 to Lee et al. there is disclosed an ETOX flash memory cell utilizing self aligned processes for forming source lines and landing pads to drain regions. In U.S. Pat. No. 5,679,591 to Lin et al. there is disclosed a raised-bitline contactless flash memory cell. A method for fabricating a split-gate EPROM cell utilizing stacked etch techniques is provided in U.S. Pat. No. 5,091,327 to Bergemont.

SUMMARY OF THE INVENTION

It is a primary objective of the invention to provide a split gate flash cell with self-aligned bit contact to word line. It is also a primary objective of the invention to provide a method of forming a split gate flash cell with self-aligned bit contact to word line through which a significant reduction in the split-gate flash cell area is possible.** As is well known in the art, a split-gate flash memory cell normally has source and drain regions that are contacted by utilizing poly plugs. Insulating layers are required as spacers to separate these poly plugs from the floating gates and control gates of the cell, and this uses up area. Furthermore, because of the high voltages required in the erase operation the spacer width cannot be decreased without paying a penalty in reduced reliability. Elimination of the poly plugs, as in the method disclosed by the present invention, eliminates the reliability issue, allows a reduction in cell area and facilitates shrinking the cell size. Instead of poly plugs, a new self aligned source/drain oxide etching procedure enables the formation of source/drain regions that are connected in rows directly within the silicon. This procedure of connecting source/drains is generally applicable to arrays of MOSFET-like devices.

BRIEF DESCRIPTION OF THE DRAWINGS

In the accompanying drawing forming a material part of this description, there is shown:

FIGS. 1a–1g show top views depicting a traditional method of forming split gate flash memory cells.

FIGS. 2a–2g show cross sectional views depicting a traditional method of forming split gate flash memory cells.

DESCRIPTION OF THE PREFERRED EMBODIMENTS

Figure 3A:
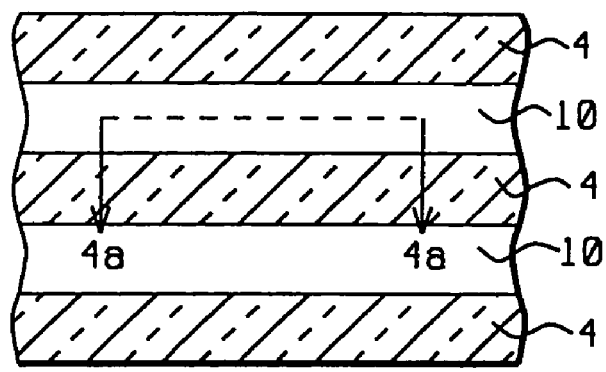
FIGS. 3a–3j show top views depicting a method of forming split gate flash memory cells according to the invention.
Figure 3B:
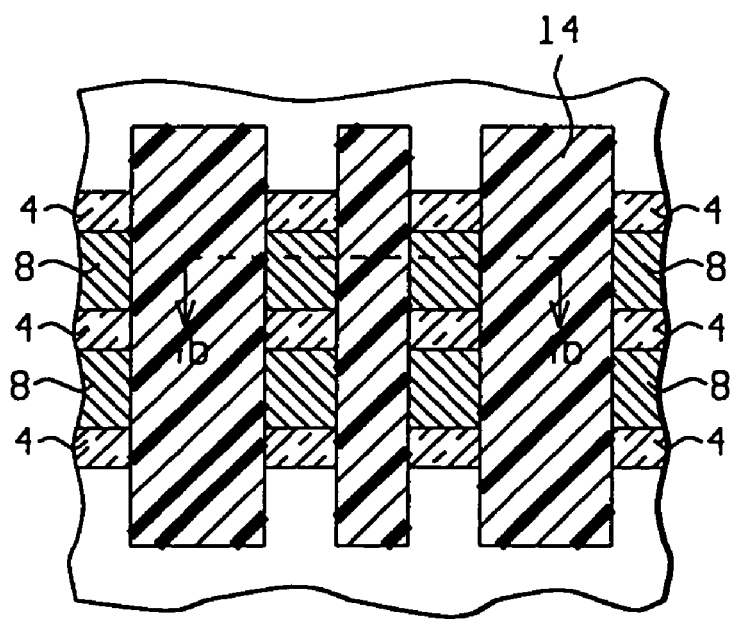
Figure 3C:
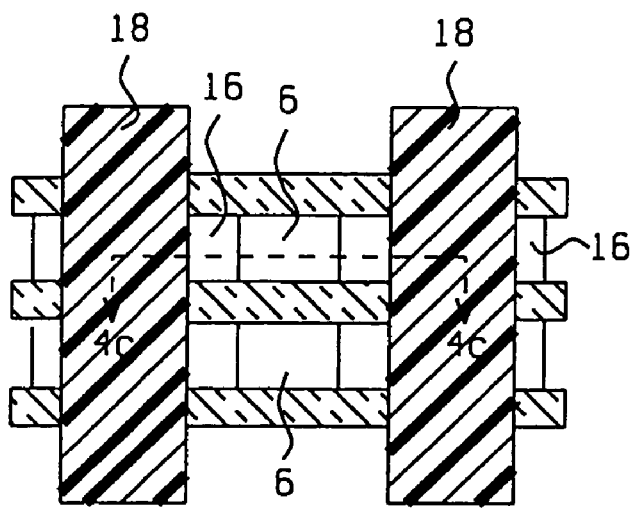
Figure 3D:
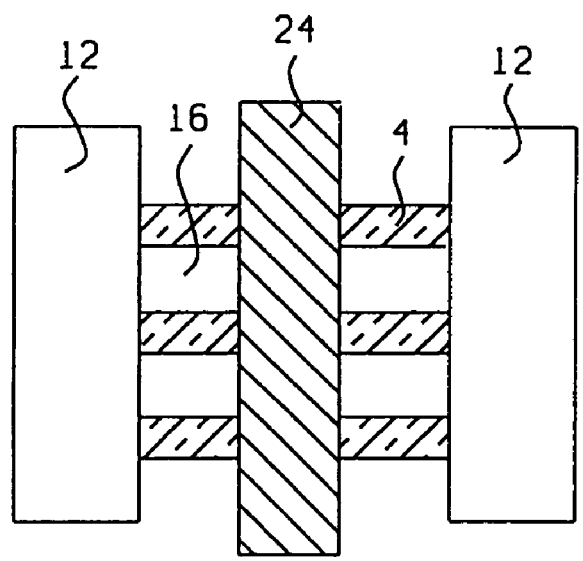
Figure 3E:
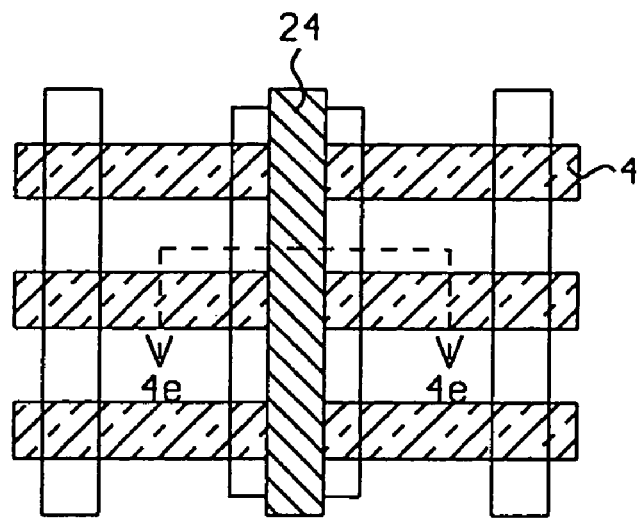
Figure 3F:
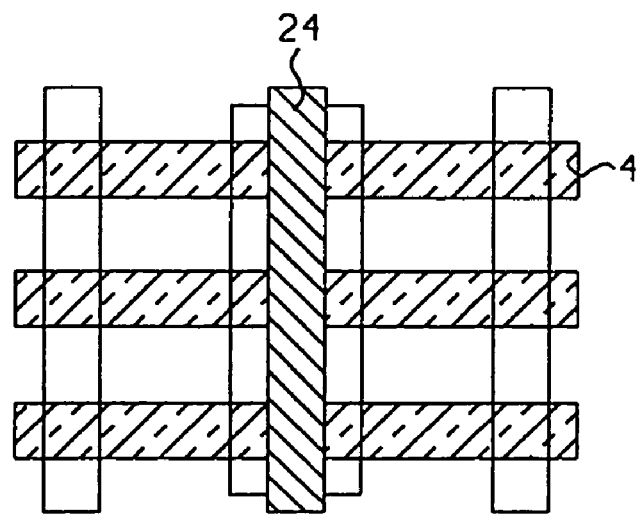
Figure 3G:
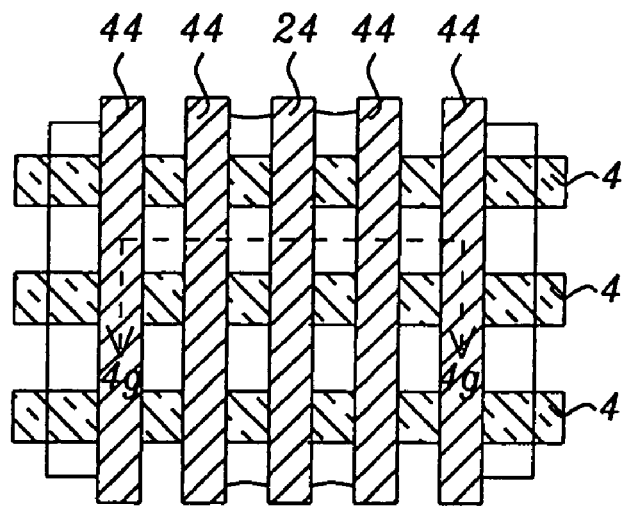
Figure 3H:
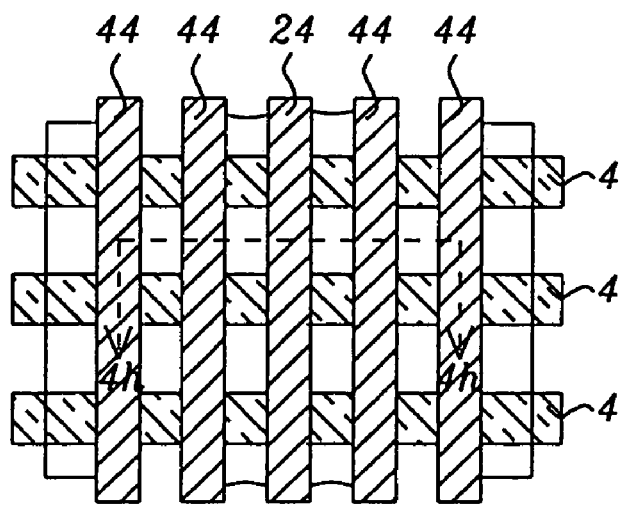
Figure 3I:
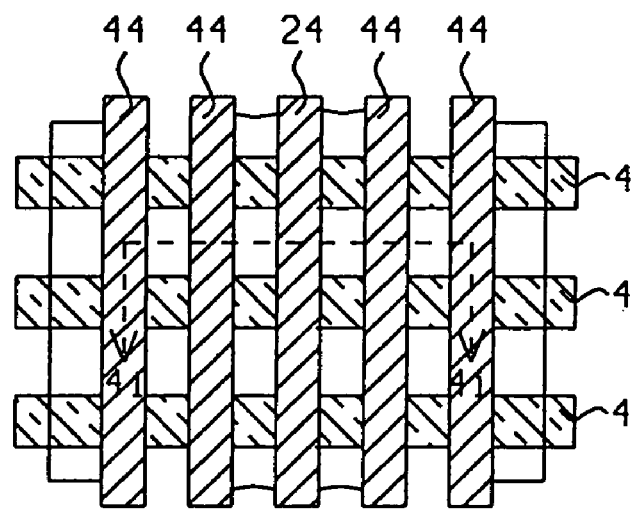
Figure 3J:
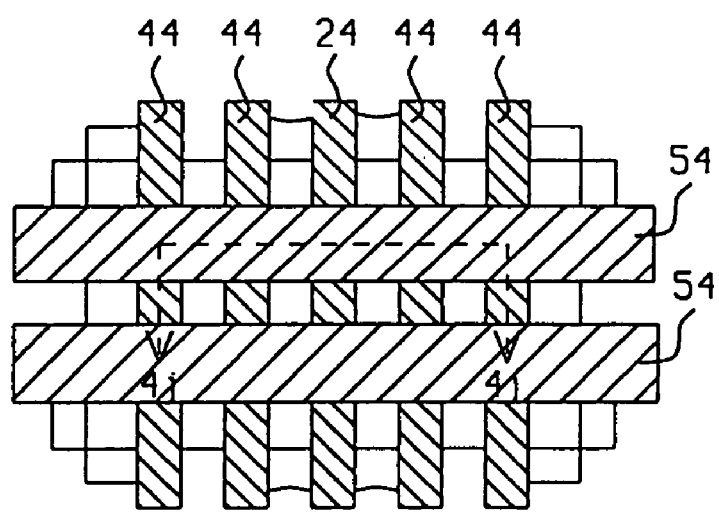
Figure 4A:
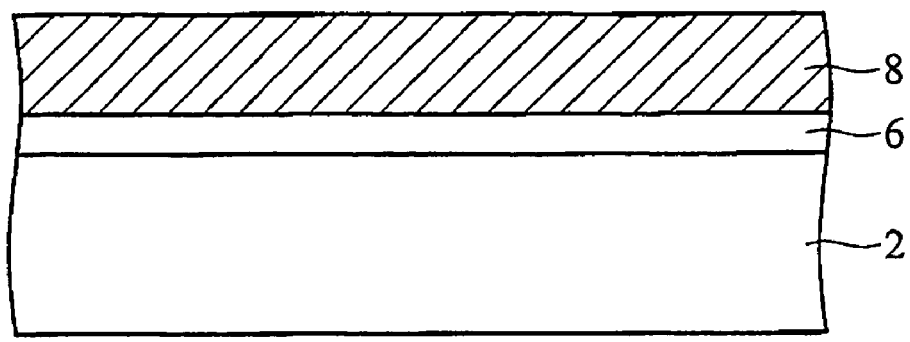
FIGS. 4a–4j show cross sectional views depicting a method of forming split gate flash memory cells according to the invention.
Figure 4B:
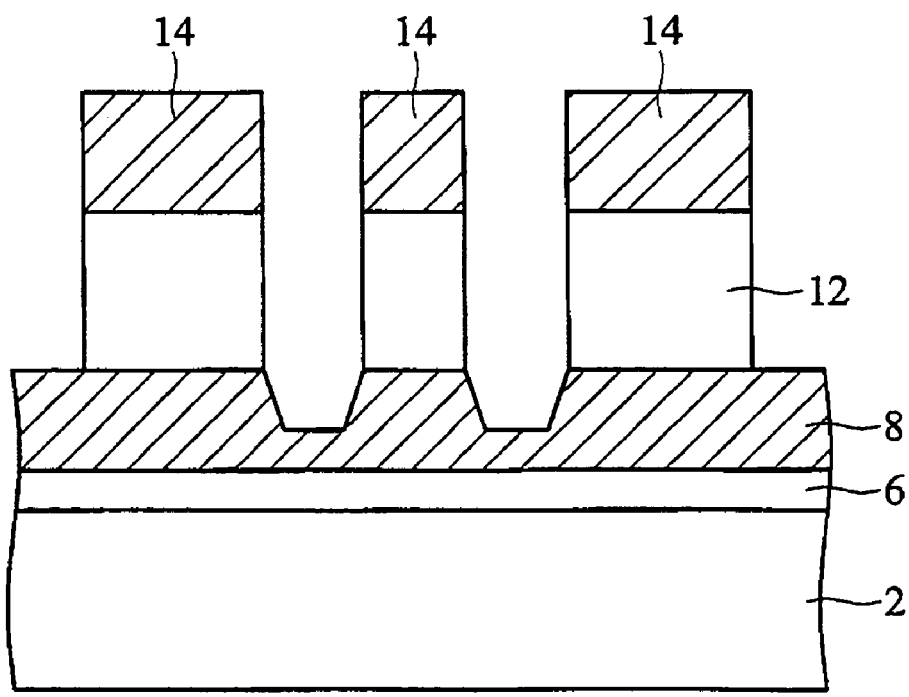
Figure 4C:
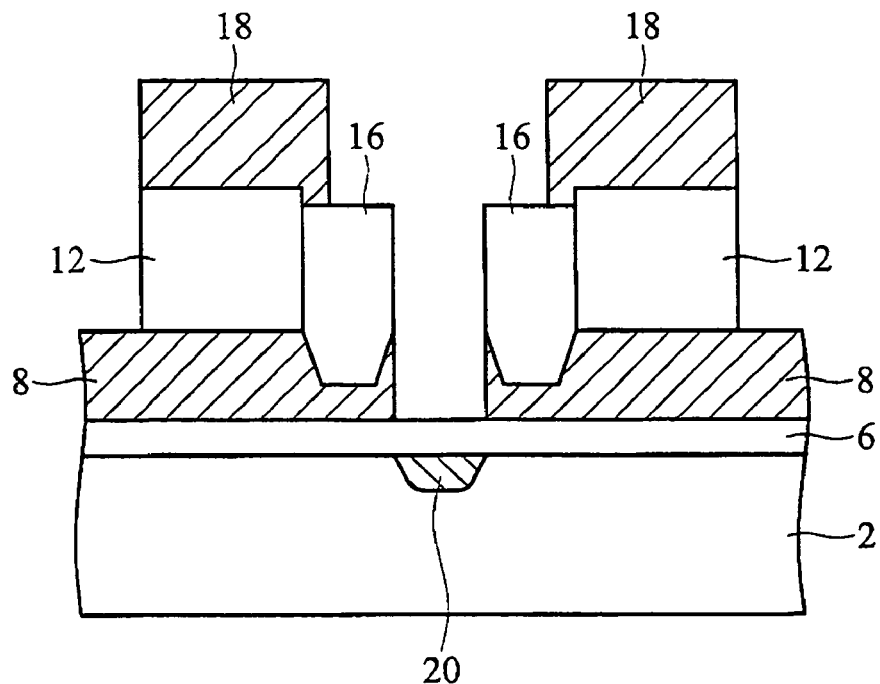
Figure 4D:
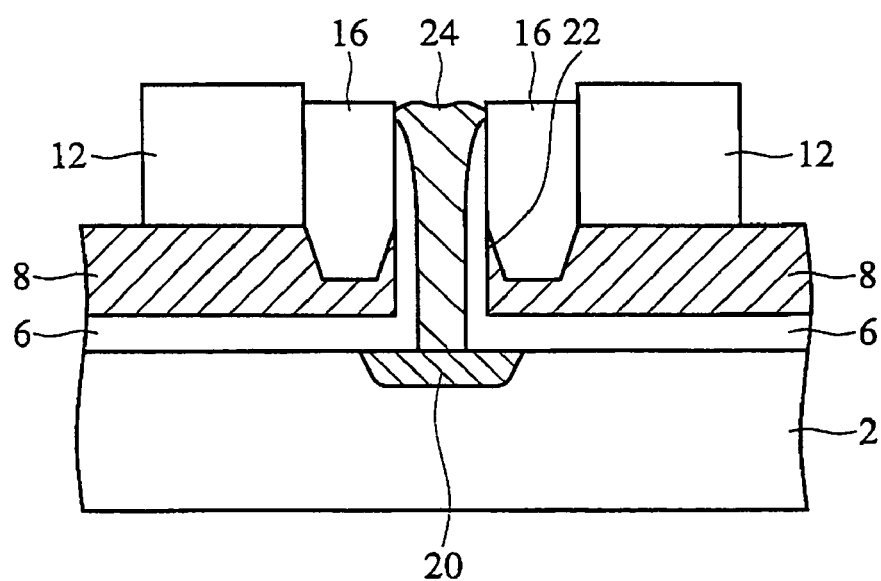
Figure 4E:
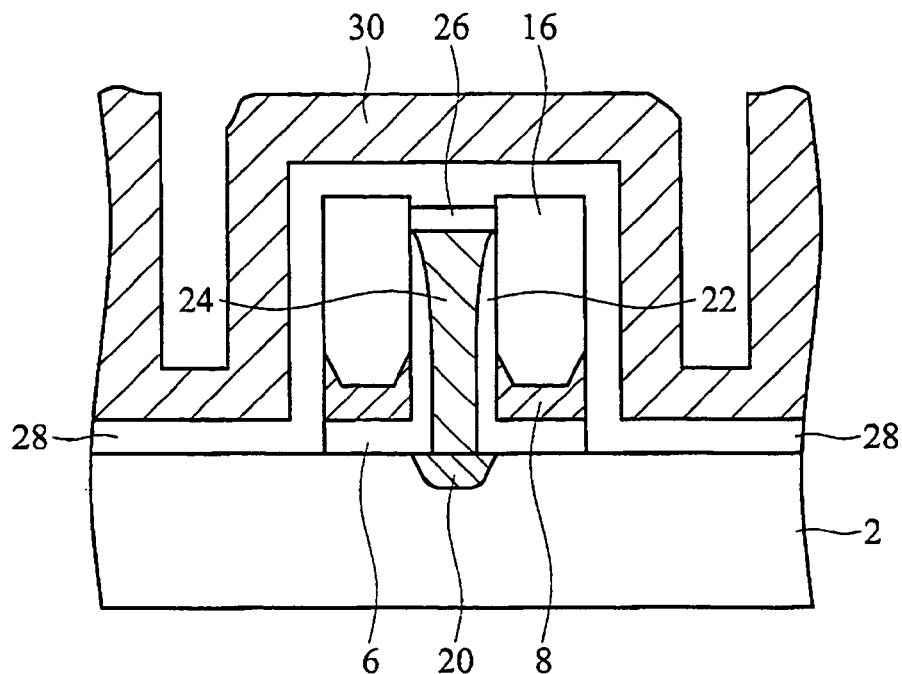
Figure 4F:
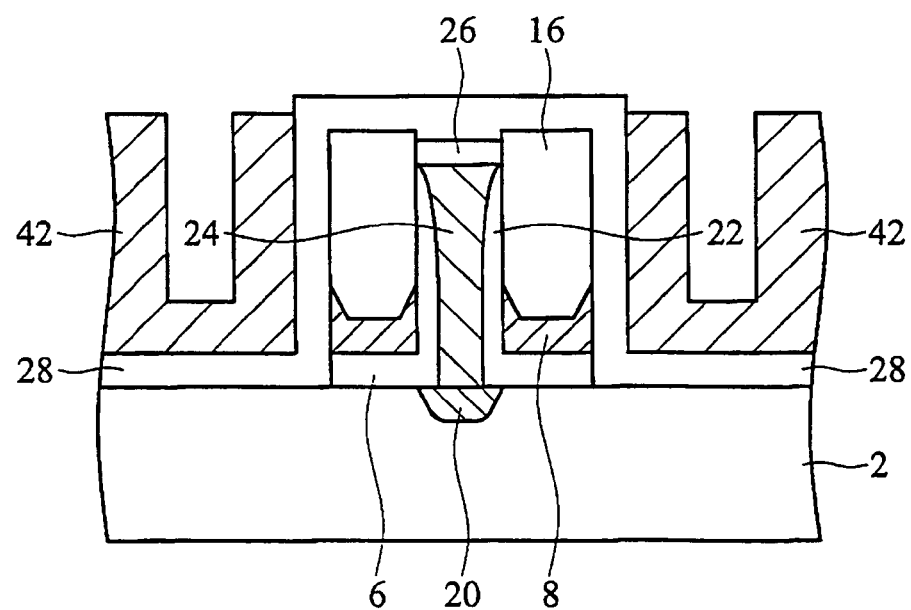
Figure 4G:
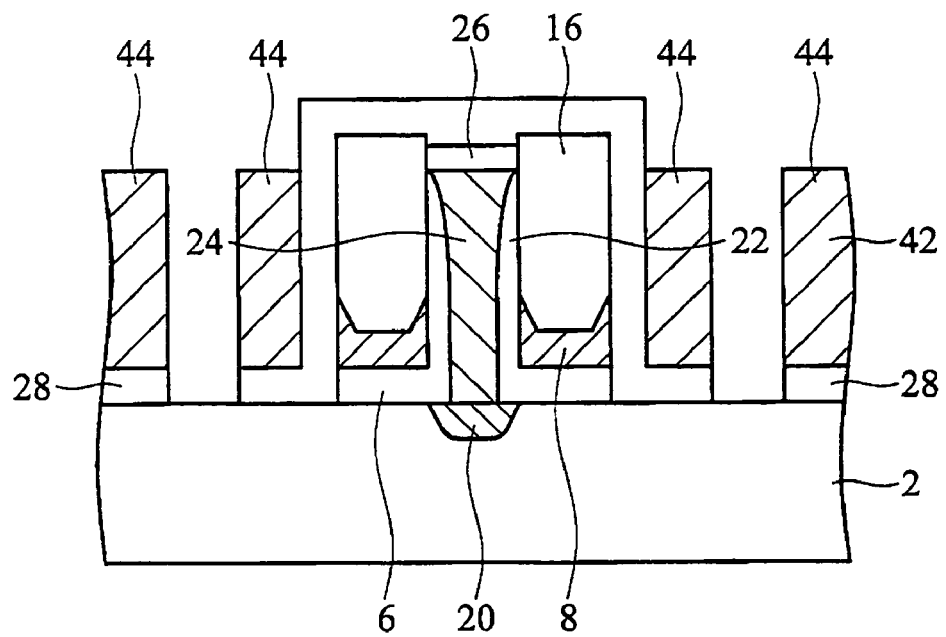
Figure 4H:
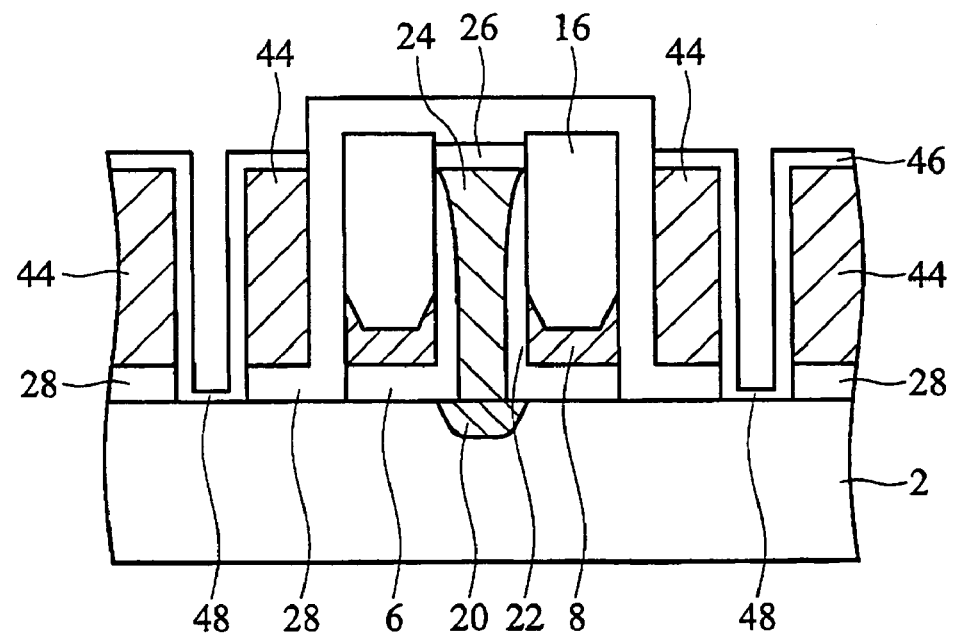
Figure 4I:
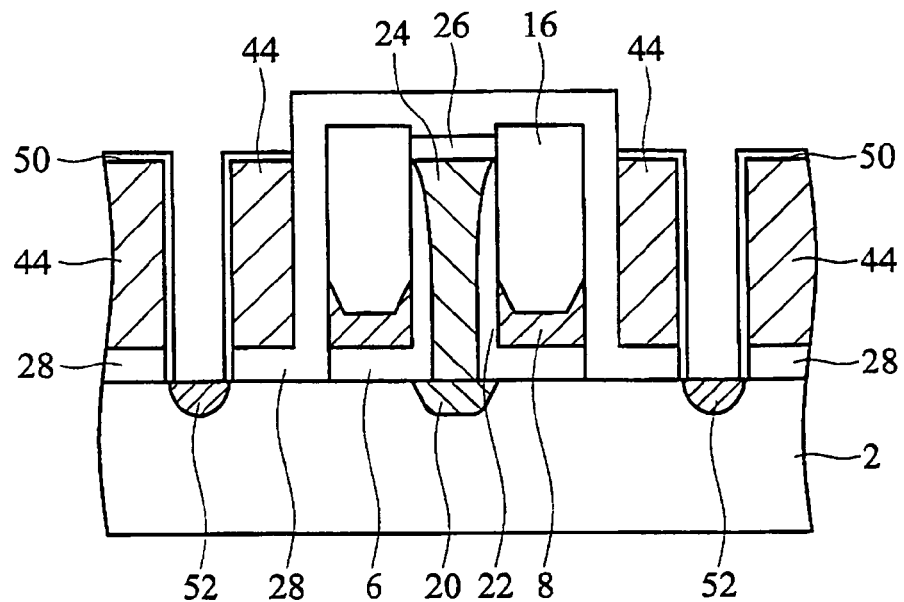
Figure 4J:
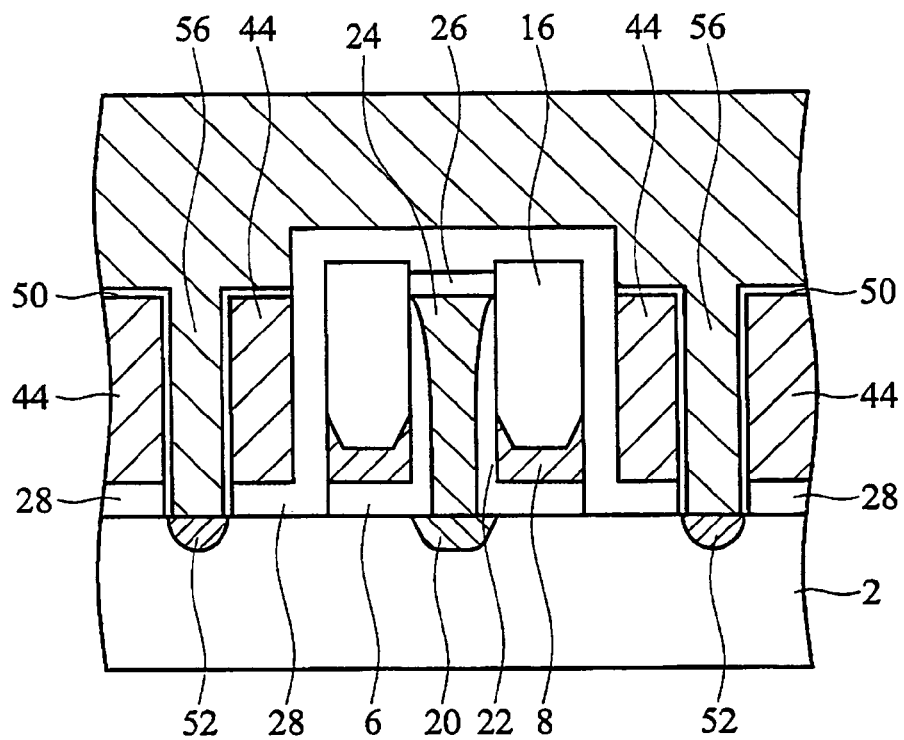

Preferred embodiments of the invention are well described with the aid of FIGS. 3a–3j and 4a–4j. A method of fabricating a novel split gate flash memory cell is presented in FIGS. 3a–3j, where top views of the cell are presented at successive stages of the process and in FIGS. 4a–4j which show the corresponding cross-sections. A floating gate oxide, 6, is formed on a semiconductor substrate, 2, which preferably is a silicon substrate, to a thickness of about 80 Angstroms, followed by deposition of a poly 1 layer, 8, to a depth of about 800 Angstroms. Active regions, 10, are defined using isolating regions, such as shallow trench isolation regions, 4. This is followed by deposition of a nitride layer, which preferably is a silicon nitride layer to a depth of about 2500 Angstroms. A photoresist layer, 14, is then formed as shown in FIGS. 3b and 4b. The photoresist pattern, 14, is used in etching the silicon nitride layer to achieve the shape of region 12 of FIG. 4b. A poly 1 etch is performed, and it is preferred to achieve the shape of region 8 as shown in FIG. 4b according to the method described in U.S. Pat. No. 6,090,668 to Lin et al., which is herein incorporated by reference. Such sloped segments of the poly 1 layer provide improved operation of the memory cell. After removal of the photoresist, an oxide 2 layer, 16, is deposited to a thickness of about 3000 Angstroms and a CMP (chemical-mechanical polishing) step is performed. A second photoresist layer, 18, is formed and used in successively etching the silicon nitride layer and the poly 1 layer to achieve the structure shown in FIGS. 3c and 4c. Source regions 20 are formed by a P ion implantation at energy of about 20 keV and to a dose of about 4E14 per cm2. Removal of the second photoresist layer is followed by deposition of an oxide 3 layer to a depth of about 500 Angstroms, which enhances the lateral diffusion of the source implant. An oxide 3 etching step is performed to achieve oxide 3 spacers, 22. A polysilicon deposition is performed to a depth of about 3000 Angstroms and a CPM step on this layer produces a poly 2 region 24, which serves to contact the source 20. At this stage the structure is as depicted in FIGS. 3d and 4d. The method proceeds with oxidation of poly 2, region 24, to form about 200 Angstroms of oxide 4, region 26. Next the nitride layer 12 is removed, and successive etches are performed of the poly 1 layer, 8, and floating gate oxide 1 layer, 6. An oxide 5 layer, 28, is then deposited conformally covering the surface of the substrate 2 and the protruding profile of the oxides 16 and 26. A poly 3 layer, 30, is then conformally deposited on the oxide layer 28 to about 2000 Angstroms. The resulting structure is as shown in FIGS. 3e and 4e. At this point the method of the invention deviates from traditional methods. Instead of immediately performing an etch back step to form poly 3 spacers 30, as in traditional methods, in which a rounded shape results, in the method of the invention a CMP process step is inserted before the poly 3 etch back. After the poly CMP step a more square profile is achieved for the poly 3, 42. As a result an essentially vertical profile is achieved for the poly 3 spacers 44, which are formed by etching hack the poly 3 region, 42. The oxide 5 layer 28 remaining on the drain area is now removed, which can be accomplished by a wet dip oxide etch or by an oxide dry etch. There follows an oxidation step in which oxide 6, 46, is grown to a thickness of about 600 Angstroms over the exposed poly 3. An oxide of about half this thickness, 48, is grown, in this oxidation step, to the undoped silicon region in the drain area, so that the thickness of the oxide in that region is about 300 Angstroms. Such a difference in thickness is due to the significantly reduced oxide growth rate of undoped silicon substrate as compared to doped poly. The oxide growth rate of doped poly is about twice that of undoped silicon. The difference in thickness of the oxides in regions 46 and 48, a consequence of the difference in oxide growth rate, is important to the implementation of the invention. The next step is to form drain regions 52. This is preferably accomplished with an implant of As ions at energy of about 60 keV and to a dose of about 4E15 per cm2. All oxide spacer etch follows in which all the oxide 48 over the drain region is etched away, but oxide 6 layers over poly 3, 50 will remain, however at a reduced thickness of about 260 Angstroms. The remaining oxide 6 layer 50 serves as an insulating layer for the underlying poly 3 spacers, which act as word lines. A square profile is preferred since more oxide remains, subsequent to the spacer oxide etch on the word line sidewalls for a square profile. This allows for the direct deposition of a poly 4 layer, which is performed to a depth of about 2000 Angstroms. No intervening interlevel dielectric layer is required. Another photoresist layer is formed and patterned so that after etching poly 4, bit lines 54 are formed connecting to the drain regions, 52 through the poly 4 contact regions 56. This completes the foliation of a split gate flash cell according to the invention, which is shown in FIGS. 3j and 4j.

Bit lines, 54 and bit contacts, 56 are insulated from the word lines, 30 by an oxide 6 layer, 50 that was grown directly on the word lines and is of a thickness sufficient to reliably insulate the word lines from the bit lines and bit contacts. No area need be devoted to account for misalignment or imperfect accuracy in the dimension of these regions. Self-alignment of the bit line and bit contact to the word line, as in the structure of the present invention, eliminates the reliability issue, allows a reduction in cell area and facilitates shrinking the cell size.

Other preferred embodiments of the invention are applicable to situations where, in partially fabricated devices on a silicon substrate there are openings to a gate oxide layer disposed over the substrate. The openings are to contain a first conductive line disposed over the oxide and a contact region, connecting a second conductive line to the silicon substrate that needs to be insulated from the first conductive line. The second conductive line passes over the first conductive line and needs to be insulated from the first conductive line. In the method of the invention a first polysilicon layer is deposited to more than cover the openings. A CMP step is performed stopping at the top of the openings. Etching back the first polysilicon layer follows to produce polysilicon spacers with essentially rectangular profiles over the gate oxide layer adjacent to the opening sidewalls and defining diminished openings to the gate oxide layer. An oxidation step is then performed that results in an oxide layer grown over the exposed surfaces of the polysilicon spacers. For a gate oxide layer about 170 Angstroms thick the oxide over the polysilicon spacers should be grown to a thickness of about 600 Angstroms. Additional oxide is also grown during the oxidation step, but to a lesser extent, under the exposed gate oxide layer in the openings. The thickness of this layer is increased to about 340 Angstrom, if the original gate oxide thickness was 170 Angstroms and 600 Angstroms is grown on the polysilicon spacers. Only about 170 Angstroms is added mainly due to the significantly reduced oxide growth rate of the undoped silicon substrate as compared to doped polysilicon. The oxide growth rate of doped poly is about twice that of undoped silicon. Also contributing to the relatively small increase in thickness is that the additional oxide is grown under the gate oxide layer that was there prior to the oxidation step. Drain regions can now be formed if required. This is preferably accomplished with an implant of As ions at energy of about 60 keV and to a dose of about 4E15 per cm2. A spacer oxide etch follows in which all the oxide over the silicon substrate of the openings is etched away, but an oxide layer will remain over the polysilicon spacer, however at a reduced thickness of about 260 Angstroms. This remaining oxide layer serves as an insulating layer for the underlying polysilicon spacers. A deposition of a second polysilicon layer follows, which is preferably performed to a depth of about 2000 Angstroms. No intervening interlevel dielectric layer is required. The second polysilicon layer filling the openings serve as contact regions. A photoresist layer is formed and patterned so that after etching the second polysilicon conductive lines are formed connected to the silicon substrate through the contact regions.

While the invention has been particularly shown and described with reference to the preferred embodiments thereof, it will be understood by those skilled in the art that various changes in form and detail may be made without departing from the spirit and scope of the invention.

What is claimed is:

1. A structure for semiconductor devices in which contact regions are self aligned to conductive lines, comprising:

A silicon substrate having thereon partially fabricated devices with first openings and second openings, first polysilicon lines disposed against insulating sidewalls of said openings in said partially fabricated devices on a silicon substrate, said first polysilicon lines extending from the top of the first openings to above said silicon substrate;

oxide layers formed over the top and sides of said first polysilicon lines that are not against insulating sidewalls of said second openings and serving to insulate the first polysilicon lines;

polysilicon contact regions disposed directly over and connecting to silicon substrate regions and filling said first and second openings; and second polysilicon lines connecting to said contact regions and disposed over said oxide layers formed on said first polysilicon lines.

2. The structure of claim 1 wherein said partially fabricated devices are split gate flash cells.

3. The structure of claim 1 wherein said insulating sidewalls are sidewalls of oxide regions.

4. The structure of claim 1 wherein said first polysilicon lines are spacers serving as word lines.

5. The structure of claim 1 wherein said oxide layers grown on said first polysilicon lines are greater than about 150 Angstroms thick.

6. The structure of claim 1 wherein said silicon substrate regions connecting to said contact regions are drain regions.

7. The stricture of claim 1 wherein said second polysilicon lines are word lines connecting to drain regions.

8. A new structure for split gate flash memories in which contact regions are self aligned to conductive lines, comprising:

a silicon region extending to the surface of a semiconductor wafer with alternating parallel columns of source and drain regions;

rows of device regions that are separated by isolation regions and are perpendicular to the source/drain columns, with polysilicon contact regions disposed over drain regions connecting the drain regions to polysilicon bit lines which run in the row direction over the device regions, and said device regions as they are situated between consecutive drain regions are, in order of occurrence: a spacer region, a floating gate region, a source line region, a floating gate region and a spacer region; spacer regions composed of polysilicon lines, which serve as word lines in the column direction, that have oxide layers that were grown on the sides facing contact regions and on the top facing bit lines and oxide layers separating the spacer regions from the silicon region and from the adjacent floating gate region; floating gate regions composed of a gate oxide layer over the silicon region that separates the silicon region from a polysilicon floating gate followed by an oxide layer, giving a total height some what greater than the other device regions, and oxide spacers separate the floating gate regions from adjacent source line regions; source line regions composed of polysilicon lines in the column direction that contact source regions at the surface of the silicon region.

9. The structure of claim 8 wherein said silicon region is p-type silicon.

10. The structure of claim 8 wherein said source and drain regions are n-type silicon regions.

11. The structure of claim 8 wherein said isolation regions are shallow trench isolation regions.

12. The structure of claim 8 wherein said polysilicon contact regions, polysilicon bit lines, polysilicon word lines, polysilicon floating gates and polysilicon source lines are P doped to achieve high conductivity.

13. The structure of claim 8 wherein the grown oxide layers on said polysilicon word lines, on the sides of facing contact regions and on the top facing bit lines, are thicker than about 150 Angstroms.

* * * * *